United States Patent Office 3,728,120

Patented Apr. 17, 1973

3,728,120

FORMATION OF RELIEF IMAGES

Edwin Hendrik Hazenbosch, Mechelen, and Albert Lucien Poot, Kantich, Belgium, assignors to Agfa-Gevaert N.V., Mortsel, Belgium No Drawing. Filed Sept. 17, 1971, Ser. No. 181,635
Claims priority, application Great Britain, Sept. 18, 1970, 44,668/70
Int. Cl. G03c *5/24, 1/72, 7/16*
U.S. Cl. 96—48 R 20 Claims

ABSTRACT OF THE DISCLOSURE

A colloid pattern is formed by a process containing the steps of:

(1) information-wise exposing a hydrophilic colloid layer containing a mixture of:
   (a) a photosensitive organic polyhalogen compound, which is capable of forming by exposure to activating electromagnetic radiation (a) halogen-containing free radical(s),
   (b) an amino compound with aromatic character, and
   (c) a hydrophilic colloid that is capable of undergoing a hardening or decrease of water-solubility by a treatment with an aldehyde hardening agent suited for the hardening of protein colloids, (2) treating the information-wise exposed colloid layer with said aldehyde hardening agent effecting a selection hardening in the unexposed portions of the recording layer, and (3) removing the exposed portions of the colloid layer by means of a wash-off treatment leaving a relief pattern corresponding with the non-exposed portions of the colloid layer.

The hydrophilic colloid layer contains preferably gelatin as hydrophilic colloid, carbon tetrabromide as photosensitive organic polyhalogen compound, diphenylamine or N,N′-diphenyl-N,N′-diethylenediamine as aromatic amine and a colored pigment for obtaining by said process a colored colloid pattern.

The present invention relates to a recording and reproduction process for producing colloid patterns corresponding with information-wise modulated electromagnetic radiation. The present invention finds a particularly interesting application in the production of direct positive halftone and line-work multicolor polymeric images.

The production of halftone color images is of interest in the field of design, e.g. in the production of color decorative patterns, color wiring and circuit diagram, cartography, color proofing and in the production or transparencies for dia- or overhead-projection.

Especially in the color field of the graphic art there is a great need for a simple and fast technique offering "color proofs" of high quality and reproducibility.

Color proofing materials serve to produce a showing proof for submission to the printer and his client to give an idea of a multicolor halftone reproduction as will be produced by the successive printing in register with the separate standard inks: yellow, magenta, cyan, and black.

Methods for quickly, inexpensively and accurately evaluating half-tone transparencies and making color proofs of images have long been desired in the printing and the graphic arts. Such methods should enable the printer to provide customers with color proofs representative of the images to be reproduced for evaluation without having to perform the entire process of preparing a printing plate and running the plate on a press to print only a few copies as proof of the quality of the plate and of the halftone separation transparencies which have been used in the exposure and thus applied in the preparation of the plate.

Known color proofing systems can be divided into two classes viz. these producing positive copies of the image to be printed starting from halftone separation negatives (negatively working color proofing) and those producing positive copies of the image to be printed starting from halftone separation positives (positively working color proofing).

Whether negative or positive halftone separation transparencies have to be used in the production of a printing form, depends on the photochemical properties (photohardening or photosolubilization) of the photoresist coating and the type of processing to yield a positive printing master.

According to known photo-hardening processes colored hardened colloid patterns corresponding with electromagnetic radiation patterns are produced and developed to relief patterns by means of an aqueous liquid using a non-light-sensitive hydrophilic colloid or polymer, which is insolubilized or cross-linked by means of a compound that is produced by irradiation of a photosensitive compound. So, e.g. dichromated hydrophilic colloid layers e.g. layers containing dichromated gelatin or gum arabic (ref. P. Glafkidès, Photographic Chemistry, Fountain Press, London, vol. II (1960), pp. 669–674) are used in so-called negatively working color proofing operating with negative halftone separation transparencies.

In the photographic color proofing technique described in the United Kingdom patent specification No. 879,049 filed Feb. 12, 1960 by General Anilin Film Corporation a positively working color film is applied, which is based on image-wise color coupler diffusion. The processed films may be used singly or in overlays.

The use of images in overlay offers a less good imitation of the final printing results since the monocolor halftone transparencies must be laid in register and inspected diascopically or against an opaque background. Further as is generally known diffusion processes cannot guarantee a very high image sharpness for always a lateral diffusion of the transferred compounds takes place.

It is one of the objects of the present invention to provide a recording and reproduction process suited for the production of colloid relief patterns having the same image values as the original applied in the exposure.

It is another object of the present invention to provide in an economic, highly reproducible and easy way multicolor proofs built up by monocolor colloid reliefs fixed in register in superposition on a single permanent support.

According to the present invention the production of the colloid relief patterns is based on the use of an organic photosensitive halogen compound having preferably at least three halogen atoms attached to a same carbon atom, which compound is capable of forming a halogen-containing free radical by exposure to activating electromagnetic radiation. During the information-wise exposure said organic polyhalogen compound strands in working relationship with an amine having an aromatic character and with a polymer or colloid that is suited to be hardened or cross-linked with an aldehyde hardening agent as is used, e.g., for hardening protein colloids.

It has been found experimentally that the information-wise exposed portions of the recording layer containing said ingredients cannot be hardened anymore by an aldehyde hardening agent. It is assumed that the information-wise produced free radicals selectively inhibit the hardening of said polymer or colloid in the exposed areas of the recording layer.

According to a preferred embodiment of the present invention for producing a positive relief pattern a process is applied comprising the following steps:

(1) information-wise exposing a hydrophilic colloid layer containing in working relationship:
  (a) a photosensitive organic polyhalogen compound which is capable of forming by exposure to activating electromagnetic radiation (a) halogen-containing free radical(s),
  (b) an amino compound having an aromatic character, and
  (c) a hydrophilic colloid that is capable of undergoing a hardening or decrease of water-solubility by a treatment with an aldehyde hardening agent suited for the hardening of protein colloids,
(2) treating the information-wise exposed colloid layer with said aldehyde hardening agent effecting a selective hardening in the unexposed portions of the recording layer, and
(3) removing the exposed portions of the colloid layer by means of a wash-off treatment leaving a relief pattern corresponding with the non-exposed portions of the colloid layer.

The coating composition preferably contains already in the coating stage (a) coloring substance(s) being fast to diffusion, an amino compound having an aromatic character and said radiation-sensitive organic polyhalogen compound in a desired amount. In other words the introduction in the recording layer of coloring or light-sensitive ingredients by diffusion or imbibition, which is difficult to control and yields less reproducible results is preferably avoided. According to the preceding embodiment, the exposure of the colloid layers proceeds in substantially dry state, which excludes chemical attack of the exposure apparatus and offers a real advantage to the operating personnel.

For the purpose of producing multicolor patterns preferably colored hydrophilic colloid layers are used that have been applied to a temporary support.

According to said embodiment multilayer colored colloid patterns are produced by transfer of the non-exposed colored colloid layers from their temporary support to a same permanent support wherein each of the transferred colloid layers after its image-wise exposure in register to activating electromagnetic radiation is hardened in the non-exposed areas by means of an aqueous hardening treatment, as a result of which the hardened colloid portions become anchored to underlying colloid portions or parts of an underlying colloid-containing layer e.g. a hydrophilic subbing layer. Any possible frilling off of the colored colloid coating during wash-off development, which is so common a difficulty in processes involving a wash-off treatment of transferred colloid coatings, is overcome in this way.

So, the production of multicolor proofs built up by superposed colored colloid relief patterns proceeds preferably by a process containing the steps of:

(1) transferring a colored hydrophilic colloid layer, which contains said amino compound and photosensitive organic polyhalogen compound from a temporary support, which is relatively hydrophobic in respect of a permanent support, to which said layer has to be transferred, to said permanent support by pressing it in the presence of an aqueous liquid (in other words in moist or dampened state) against said colloid layer, and removing the temporary support, thus leaving the said layer on the permanent support,
(2) exposing the transferred colloid layer in substantially dry state to information-wise modulated electromagnetic radiation resulting in the information-wise photolysis of the halogen-containing compound,
(3) treating the exposed colloid layer with an aldehyde hardening agent that hardens said polymeric compound in the unexposed portions,
(4) removing the exposed portions of the colloid layer by a wash-off treatment, and in order to produce superposed color patterns on a same permanent support repeating the steps (1), (2), (3) and (4) with said hydrophilic colloid layers having the desired color.

Photosensitive halogen-containing compounds which are illustrative of the type suitable for practising the invention corresponds to the following general formula:

$$R—CX_3$$

wherein:

R is hydrogen, chlorine, bromine or iodine, an aliphatic group including a substituted aliphatic group, e.g. an alkyl group including a substituted alkyl group, or an aromatic hydrocarbon radical including a substituted aromatic hydrocarbon group, e.g. a phenyl group, a heterocyclic group including a substituted heterocyclic group, an acyl group, including a carboxylic acid acyl group, a sulphonic acid acyl group and a sulphinic acid acyl group, a carboxyl group, a carboxylic acid ester group, an amide group or an aldehyde group, and each of X is chlorine, bromine, or iodine.

Organic polyhalogen compounds, which have been found to be particularly suitable for the process according to the present invention are carbon tetrabromide, bromoform, iodoform, β-tribromoethanol, trichlorobromomethane, hexabromoethane, bromodichloromethane, pentachloroethane, methyl trichloroacetate, ethyl tribromoacetate, tribromoacetamide, tribromoacetaldehyde, tribromomethylbenzene, p - nitrotribromomethylbenzene, hexachloroethane, pentabromoethane, tetrabromobutane, α,α,α-tribromoacetophenone, 4 - bromo-α,α,α-tribromoacetophenone, 2-tribromomethylquinoline, and 2 - tribromomethylquinoxaline.

Suitable amines having an aromatic character and that are used in working relationship with photosensitive organic polyhalogen compound include primary, secondary and tertiary aromatic amines e.g. the amines corresponding to the following general formula:

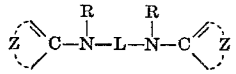

wherein:

R represents an alkyl group including a substituted alkyl group e.g. a $C_1$–$C_5$ alkyl group, an aralkyl group e.g. a benzyl group, a hydroxyalkyl group e.g. a hydroxyethyl group or a sulphoalkyl group e.g. a $C_1$–$C_5$ sulphoalkyl group, Z represents the necessary atoms to close a ring or ring system having an aromatic character including such ring or ring system in substituted form e.g. a benzene ring, or a naphthalene ring and such rings substituted e.g. with halogen, an alkyl group, an amino or substituted amino group, L represents a bivalent organic group capable to link two amino groups together e.g. an alkylene group including a substituted alkylene group, or organic group containing alkylene groups such as methylene groups interrupted by an aromatic group e.g. by a phenylene group or by heteroatoms such as oxygen or a bivalent amino group or substituted bivalent amino group e.g. the amino groups are linked together by a

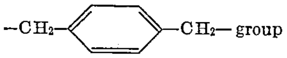

a $-CH_2-O-CH_2-$ group or a

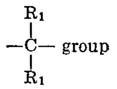

wherein $R_1$ represents hydrogen an alkyl group including a substituted alkyl group e.g. an aralkyl group.

A particularly suited amine falling within the scope of said general formula is N,N'-diphenyl-N,N'-diethyl-ethylenediamine.

Other particularly suited aromatic amines are: arylamines such as diphenylamine, dibenzylamine, triphenylamine, N,N-diethylaniline, N,N-dimethylaniline, N-hydroxyethyl - N - ethylaniline, o-amino-diphenylamine, p - hydroxydiphenylamine, α - naphthylamine, p - amino-N - diethylaniline, p - aminodiphenyl, 2 - aminodiphenyl, p - aminodiphenylamine, N - benzylaniline, N - butylaniline, N - sec.butylaniline, 2,4 - diaminodiphenylamine, N,N' - dibenzylethylenediamine, 2,6 - di - tert.butylamine, α - dimethylamino - p - cresol, 3,4 - dichloroaniline, m-N - diethylaminophenol, N - diethylaminotoluene, N,N'-diphenylethylenediamine, diphenyl - p - phenylenediamine, p - dimethylaminobenzaldehyde, o - (dimethylamino-methyl) - phenol, m - dimethylaminophenol, N,N' - dimethyl - α - naphthylamine, di - β - naphthylamine, di-β-naphthyl - p - phenylenediamine, di - n - propylaniline, N - ethylaniline, N,N - benzylethylaniline, N - ethyl - N-phenylethanolamine, N - (2 - ethylhexyl) - aniline, N-ethyl - o - toluidine, N - ethyl - m - toluidine, 2 - phenylaminoethanol, N - phenyl - cyclohexylamine, phenyl - α-naphthylamine, phenyl - β - naphthylamine, 3 - hydroxydiphenylamine, N - methylaniline, N - (α - methylbenzyl) - diethanolamine, N - (α - methylbenzyl) - ethanolamine, N - methyl - o - toluidine, p - tolyl - α - naphthylamine, N - butyl - N - ω - amino acetic acid propylaniline, n - ethyl - N - ω - sulphonic acid butyl - aniline, 3,5 - diethyl - N - n - hexadecylaniline, 3,5 - di - tert. butyl - N,N-dimethylaniline, 3,5-dimethyl-N-n-hexadecyl-aniline, N-n-hexadecylaniline, N,N - ethyl - octylaniline, N,N-ethyl-n-hexadecylaniline, N,N - ethyl - p - toluene - sulphonylaniline, N,N - ethyl - dodecylaniline, β - (N-ethylanilino)-ethyl carbanilate, and heterocyclic amino compounds having an aromatic character such as N-vinylcarbazole, indole, 1,2,3 - trimethyl - indole, 2 - aminobenzimidazole, 3 - phenylindole, α - diethylaminopyridine or N-ethylcarbazole or 1,2 - dihydro - 2,2,4 - trimethylquinoline.

Said amines are readily dispersible in an aqueous colloid medium.

By the term in "working relationship" has to be understood that the free radicals produced on exposure can come in chemical reactive contact with the aromatic amino compound and hydrophilic colloid.

According to a preferred embodiment the photosensitive halogen-containing organic compound is applied in the hydrophilic colloid layer in dissolved form in an organic high boiling (boiling point about 120° C./760 mm. Hg) water-immiscible substance that makes it possible to incorporate the hydrophobic polyhalogen compound in a very finely divided dispersed phase into the surrounding hydrophilic colloid medium.

Substances suited for that purpose are described in the U.S. patent specification No. 3,244,519 of André K. Schwerin issued Apr. 5, 1966 as crystalloidal material and particularly suited are tricresyl phosphate, dibutyl phthalate, N - vinylcarbazole and 1,2 - dihydro-2,2,4-trimethylquinoline.

The amount of photosensitive polyhalogenated organic compound per sq. m. is preferably in the range of 0.2 to 5 g. and the amount of aromatic amine in the range of 0.2 to 5 g.

The photosensitivity of the recording material containing a mixture of photosensitive organic polyhalogen compound and the amine having an aromatic character can be enhanced and extended into the visible spectrum by means of spectral sensitizing agents. Suitable spectral sensitizing agents are compounds having the property of absorbing electromagnetic energy and which can transduce that energy and transfer it through an active contact with a phototransformable substances to said substance. A survey of such sensitizing agents is given in the U.S. patent specification No. 3,503,745 of Y. Yamada and T. H. Garlend issued Jan. 28, 1966, the French patent specification No. 1,574,740 filed Mar. 11, 1968 by Bell and Howell Co. and the references cited therein.

For the present invention preference is given to the use of so-called spectrally sensitizing dye bases more particularly those of the styryl and azastyryl type, e.g.

4-[p-dimethylaminostyryl]quinoline and
2-[p-dimethylaminostyryl]quinoline.

Preferably used aldehyde-hardenable colloids are hydrophilic water-soluble colloid polymers containing active hydrogen atoms as are present, e.g., in hydroxyl groups and amino groups. Both qualitative characterization and quantitative determination of active hydrogen can be carried out by the procedure known as the Zerewitinoff active hydrogen determination. Hardenable colloids containing active hydrogen atoms are, e.g., polyvinyl alcohol, polyacrylamide or gelatin, and other film or stratum-forming proteinaceous colloids.

In the present invention best results are obtained with aldehyde-hardenable hydrophilic water-soluble colloids that possess the property of sol-gel transformation such as gelatin, which offers an easy transfer and good adherence of the photosensitive layer to the permanent support. So-gel transformation is explained by R. J. Croome and F. G. Clegg in Photographic Gelatin, The Focal Press, London (1965), pages 37–39.

The above hydrophilic colloids may be used in admixture with proper latent hardening agents and cross-linking agents that split off as hardening species on heating, e.g. latent polyisocyanates as described in the United Kingdom patent specifications Nos. 991,676 filed Jan. 18, 1963 and 1,058,425 filed June 15, 1964 both by Gevaert Photo-Producten N.V.

In the production of superposed multicolor colloid patterns the dyes used in the photosensitive colloid layers have to be resistant to diffusion and chemically inert in the processing and washing liquid(s) as much as possible. When being used in color proofing they have to match with the absorption spectrum of the standard process inks as close as possible. Particulars about standard color inks can be found in H. M. Cartwright, Ilford Graphic Arts Manual (1962), vol. I, pages 502 to 504.

There exist "cold" and "warm" color standards. Cold color tones are, e.g., standardized in the U.S.A. in the GATF-Color Charts and in the German Standards DIN 16508 and 16509. Warm color tones are standardized, e.g. in the German Standard DIN 16538.

The cold color standards are characterized by the use of fairly pure magneta pigments, mostly insolubilized rhodamine and phloxine-dyes, which have a very low side-absorption in blue region of the spectrum.

The warm color standards are characterized by the use of insolubilized azo dyestuffs. Said dyestuffs are more resistant to solvents, e.g. alcohol, than the rhodamines and phloxines, but they possess a much higher side-absorption in the blue region of the spectrum.

It has been found experimentally that pigments, which are insoluble or very poorly soluble in water and inorganic liquids of the alcohol or polyhydric alcohol type, e.g. glycerol, fulfill the requirements or resistance to diffusion Pigment dyes that are applied from an aqueous dispersion are used preferably, though the use of substantive dyes that are chemically linked to a colloid or polymer is not excluded. For color-proofing purposes the hardenable colloid layer contains pigments in a concentration so high that the optical density in the wavelength range of maximum absorption is at least 0.35.

Apart from the use of dyes, the absorption spectrum of which has to satisfy particular requirements for color-proofing, all colors are considered e.g. cyan, light-cyan, magneta, warm magenta, black, yellow, green, brown, orange, red, white blue as well as metallic colors such as pale gold, rich gold, copper, and silver. In other words the term "color" in the present invention encompasses all pure and mixed colors as well as black-and-white.

Non-migratory pigments suitable for use in the present invention are known under the name "Pigmosol" and "Colanyl" dyes. "Pigmosol" and "Colanyl" are trademarks of Bedische Anilin- & Soda-Fabrik A. G., Ludwigshafen, (Rhine) W. Germany, for organic pigment dyes that are mixed with a dispersing agent for aqueous medium. These pigment dyes excel in resistance to light, heat, acids, bases, oxidizing agents, and solvents. They are insoluble in hydrophilic colloids such as gelatin.

The black pigment for the black-toned part image is preferably carbon black.

Even if the pigments are completely inert in the aqueous processing and washing liquids they may stain to some extent the permanent support at the non-exposed areas as a result of simple adhesion forces. In order to avoid a direct contact of the pigments(s) with the permanent support the pigment coating on the temporary support is over-coated with a hydrophilic colloid layer (top layer), which does not contain pigments or dyes for forming the image. On transfer of such composite coating the top layer comes into contact with the permanent support and is sandwiched between said support and the pigmented coating. The top layer contains the same colloid(s) as the colored layer and is preferably of the same composition as the pigmented coating except for the presence of the visible image-forming pigment(s) or dyes thereon. The top layer, however, may contain a small amount of translucent pigments, e.g. silica particles, protruding from the layer and being a few microns thicker than the top layer. They avoid sticking of rolled up sheet material at relatively high (e.g. 60%) relative humidity. The top layer contains, e.g., 1 to 1.5 g. of gelatin per sq. m.

In order to obtain images with a good resolution, relatively thin radiation-sensitive colored colloid coatings are preferred. Preferably they have a thickness in the range of $1\mu$ and $15\mu$. Good results are obtained with colored colloid layers containing 2 to 10 g. of gelatin per sq. m. Very good results are obtained with colored layers having a thickness of 4 to $5\mu$ and containing 2.5 to 3 g. of gelatin per sq. m. The colloid layers preferably contain at least 50% by weight of gelatin.

The adhering power of the transferable coating to its temporary support, preferably a flexible one, has to be adjusted in such a way that an easy stripping off from the temporary support is possible after pressing the pigment coating into contact with the permanent support. Therefore, a relatively hydrophobic temporary support e.g. an unsubbed cellulose triacetate sheet, a polystyrene sheet, a polyester sheet, or sheet of copoly(vinyl acetate/vinyl chloride) and a permanent support having a hydrophilic surface, e.g. a polyethylene terephthalate support subbed for adhering gelatin coatings is used preferably, e.g. a hydrophobic support subbed as described in the Belgian patent specification No. 721,469 filed Sept. 27, 1968 by Gevaert-Agfa N.V. According to a preferred embodiment the photosensitive coating is composed in such a way that its adherence to the temporary support in wet state is less than in dry state. This can be attained by the addition of hygroscopic agents, e.g. a water-soluble organic hydroscopic compound e.g. glycerol, and the use of wetting and plasticizing agents. After wash-off treatment the colloid relief pattern is preferably dehydrate (unswelled) with a water-attracting alkanol/water mixture preferably an ethanol/water mixture in order to provide a sufficient mechanical strength and to prevent damage when transferring a further colloid layer thereon. A temporary support having a repelling power for wet gelatin coatings is, e.g., a paper base coated with a polyethylene layer, a paper base impregnated with wax, a paper base coated with a layer of cellulose nitrate or a paper base coated with a layer of insolubilized polyvinyl alcohol or a layer of alginic acid insolubilized with an alkaline earth metal salt.

The permanent support may be rigid as well as flexible and only must present by itself or by means of (a) subbing layer(s) a good adherence in wet as well as in dry state for the transferable hydrophilic colloid coating.

Depending on the use of the multicolor print the permanent support is transparent or opaque. So, it is possible to use metal layers or sheets, glass, ceramics, resin supports and paper impermeabilized for the processing and washing liquids.

For purposes such as color-proofing wherein several exposures have to be effected in register it is necessary to use a resin support with high dimensional stability.

Resin supports characterized by a high mechanical strength and very low water-absorption and consequently high dimensional stability in dry and wet state can be formed from a linear polyester, e.g. polyethylene terephthalate. Good results as to dimensional stability are obtained with aluminum sheets sandwiched between two high wet-strength paper sheets although this material is rather expensive.

Permanent resin supports can be made opaque by coating them with a matted subbing layer or by matting or coloring them in the mass. The matting may be effected by pigments known therefor in the art, e.g. titanium dioxide, zinc oxide, and barium sulphate. Matting can also be obtained by producing a "blushcoat" as described e.g. in Canadian patent specification No. 654,438 filed Aug. 12, 1959 by Labelon Tape Co.

Hydrophobic resin supports to be used as permanent support according to the present invention are coated with one or more subbing layers for a hydrophilic colloid layer.

Preferred subbing layers for use on a permanent hydrophobic resin support, e.g. a polyethylene terephthalate support, are described in the Belgian patent specification No. 721,469 filed Sept. 27, 1968 by Gevaert-Agfa N.V. mentioned above. In the said specification, which has to be read in conjunction herewith, a sheet material is claimed that successively comprises a hydrophobic film support, a layer (A) which directly adheres to the said hydrophobic film support and comprises a copolymer formed from 45 to 99.5% by weight of at least one of the chlorine-containing monomers vinylidene chloride and vinyl chloride, from 0.5 to 10% by weight of an ethylenically unsaturated hydrophilic monomer, and from 0 to 54.5% by weight of at least one other copolymerizable ethylenically unsaturated monomer; and a layer (B) comprising in a ratio of 1:5 to 1:0.5 by weight a mixture of gelatin and a copolymer of 30 to 70% by weight of butadiene with at least one copolymerizable ethylenically unsaturated monomer.

Preferably the subbed permanent film support consists of a hydrophobic film support and the combination of the two anchoring subbing layers as described above. The hydrophobic film support may be a film of cellulose triacetate, polyethylene terephthalate, polycarbonate, polystyrene, polymethacrylic acid ester, etc. The subbed hydrophobic film support may be provided on only one side or on both sides with the combination of subbing layers.

A detailed description will now be given of the composition and structure of a preferred light-sensitive material, and of its use in the production according to the present invention of a multicolor image.

A coating composition is prepared containing gelatin dissolved in water wherein (a) selected pigment(s) is (are) dispersed in a concentration to yield after coating and drying a recording layer having an optical density in the wavelength range of maximal absorption of at least 0.4. The coating composition preferably contains at least 50% by weight of gelatin in respect of the pigment particles and a proper amount of plasticizing agent and repellent (a water-attracting compound e.g. glycerol) to provide to the coating a sufficient adherence to its temporary support and to enable its easy wet (aqueous) stripping off from the temporary support, e.g. an unsubbed cellulose triacetate or polyethylene terephthalate support. In addition to said ingredients the coating composition contains (an) organic halogen compound(s) having at least three halogen atoms attached to a same carbon atom and said aromatic amine, the halogen compound being preferbly dissolved in a dispersed high boiling water-immiscible organic substance, in an amount high enough to allow selective hardening of the colloid in the unexposed portions. A suitable amount of photosensitive organic halogen compound(s) is in the range of 15 to 80% by weight in respect of the dry gelatin. A suitable amount of amine(s) having an aromatic character is also in the range of 15 to 80% by weight in respect of the dry gelatin.

The coating preferably contains 1 to 10 g. of gelatin per sq. m. Optimal results are obtained with 3 g. of gelatin per sq. m.

In order to improve the sharpness of the graphic reproduction the gelatin layer may contain a screening dye.

A second coating, the so-called top-layer, the composition of which is preferably identical to the foregonig, except that no pigment(s) are present, is coated on the first one. The second coating preferably contains 0.5 to 5 g. of gelatin per sq. m.

The second coating forms with the underlying pigmented coating one hardenable double layer firmly bound together, in other words a "composite layer" which can be transferred as a whole from the temporary support to the permanent support.

A set of materials containing such a composite layer is preferably used for preparing a multicolor "color proofing image." A usual set contains yellow, magenta, cyan, and black pigment coatings on separate cellulose triacetate supports.

The permanent support, e.g. a polyethylene terephthalate support, is successively coated with a first subbing layer on the basis of a copolymer containing hydrophobic and hydrophilic structural units in a proper ratio and a second subbing layer, which is more hydrophilic than the first one and contains gelatin, a hydrophobic latex polymer and a white pigment, e.g. titanium dioxide particles, for conferring an opaque aspect to the support.

The permanent support perferably applied in color proofing is a hydrophobic polyester resin support subbed with a system of subbing layers as described in the Belgian patent specification No. 721,469 mentioned above. The opaque white support has an opacity and whiteness resembling as much as possible the whiteness and opacity of the printing stock whereon the actual print has to be made.

The preparation of a multicolor "color proof" then proceeds according to a preferred embodiment as follows.

To said permanent support subbed as described above the unexposed pigment coating is transferred by pressing the surface of the subbing layer and of the unexposed coating together in the presence of an aqueous liquid and peeling off the temporary cellulose triacetate support.

The transfer can be carried out in an apparatus, in which the materials involved are pressed together between rollers. A suitable apparatus for that purpose is described in the Belgian patent specification No. 740,292 filed Oct. 15, 1969 by Gevaert-Agfa N.V.

The said apparatus is particularly suitable for use in transferring in wet or moist state colloid layers from a temporary support to a permanent support and such apparatus comprises a pair of co-operating pressure rollers and means for driving said rollers, a first platform for supporting the permanent support prior to its engagement by said pressure rollers, said platform being formed in such a way as to make interrupted or discontinuous contact with the permanent support when this is placed thereon, a second platform arranged over and separated from the first surface for supporting at least the leading part of the temporary support to keep said temporary support separated from a permanent support when this is located on the first platform, the forward ends of both said platforms being disposed proximate to the nip of the pressure rollers so that the supports as they are advanced are gripped by said rollers and progressively pressed together.

After the transfer and drying i.e. with a hot air stream the photosensitive gelatin layer is exposed through a first halftone separation transparency, which in this case is a halftone positive of the original. In a particular case of four-color printing a cyan pigment coating is first applied to the permanent support and exposed through the cyan printer halftone separation positive of the original. After the exposure the photosensitive coating is treated with an aqueous liquid containing an aldehyde hardening agent hardening the coating in the unexposed portions, whereupon the exposed portions are washed away selectively with a jet of tap water preferably at 30–50° C. In successive order the same steps are carried out for the yellow, magenta, and black-pigmented coating, which are exposed in register on the same support carrying already the cyan pigment coating but respectively through the yellow printer halftone, magenta printer halftone and black printer halftone positive of the original. However, the order wherein the color relief images are made can be chosen arbitrarily.

The exposure, preferably being a vacuum frame contact-exposure, is carried out with a light source sufficiently emitting in the ultraviolet range of the spectrum, e.g. with a carbon arc, a xenon arc, or a high pressure mercury vapour tube. The duration of the exposure does not only depend on the photosensitivity of the organic polyhalogen compound but also on the type of the pigment, more particularly on its inherent absorption of ultraviolet radiation and blue light. In order to obtain a halftone relief having an optimal dot sharpness the pigment coating is exposed while being in direct contact with the image-containing layer of the transparent original.

The hardening of the photosensitive coating in its unexposed portions is preferably carried out with an aqueous solution of an aldehyde hardening agent or composition producing such agent in situ, e.g. an aqueous solution containing formaldehyde or bishydroxymethylurea. A quantity of 1–3 grams of formaldehyde per 100 g. of gelatin is sufficient to obtain satisfactory hardening.

Many other aldehydes have been described as active hardening agents for gelatin. Particularly suited in that respect are glyoxal, and glutardialdehyde.

The choice of aldehyde hardener depends on the selectiveness of hardening between exposed and unexposed portions of the photosensitive coating and the effectiveness and speed of hardening desired with respect to a selected hardenable colloid.

Formaldehyde-hardening can be accelerated by the addition of glutardialdehyde.

Preferred hardening solutions contain 1 to 20 g. of glutardialdehyde per litre.

After the hardening step the exposed portions of the recording layer are preferably washed off without mechanical rubbing by means of running water at a temperature preferably between 30 and 50° C. The relief image, which has absorbed an amount of water, is then preferably dehydrated (unswelled) in a dehydrating liquid, e.g. an alcoholic liquid containing 70 to 30% by volume of water and 30 to 70% by volume of ethanol. Excess of liquid is preferably removed by squeezing the relief between two smooth soft rollers, e.g. rubber rollers.

The permanent support carrying the first relief image (the cyan relief image) is pressed between the same rollers while in contact with another pigment coating, e.g. the yellow pigment coating, and after a few seconds of contact the temporary support is peeled off, thus overall transferring the yellow pigment coating on the cyan part image produced already. Said yellow pigment coating is dried before contact exposure. Drying proceeds, e.g. with an air current of 40° C.

The whole procedure of exposure (exposure in register), hardening treatment, washing-off, and dehydration is repeated for the yellow coating and the same applied for the magenta printer image and black printer image.

According to a special embodiment the hardening treatment and washing off proceeds with or in one and same liquid.

The obtained colloid pattern or multilayer colloid pattern can be protected and given a glossy appearance by a transparent resin top-coat, which according to a preferred embodiment is applied by spraying. A suitable "spray-cover" consists of polyisobutyl methacrylate.

The production of a multicolor proof is illustrated in more details in the following examples. The percentages are by weight if not otherwise indicated.

EXAMPLE 1

(I) Preparation of the Photosensitive Layers

(A) Cyan colored photosensitive layer (1) Preliminary preparation of the photosensitive dispersion: In 250 ml. aqueous solution of 30 g. of gelatin 10 g. of N-vinylcarbazole were dispersed for 3 min. at 50° C. Hereby due to the vigorous stirring the temperature rose to 72° C. Then 25 g. of tetrabromomethane were added and dispersed for 2 min., whereafter 15 g. of diphenylamine were admixed and dispersed for further 2 min. The dispersion was deaerated until most of the air bubbles had disappeared.

(2) Preparation of the photosensitive colored layer.—The following ingredients were mixed at 50° C.:

| | | |
|---|---|---|
| The dispersion prepared as described above | | |
| 10 % aqueous solution of a wetting agent [1] | ml. | 13.5 |
| A cyan pigment dispersion of: Heliogenblau B Colanyl Teig (marketed by Badische Anilin- & Soda-Fabrik A.G., Ludwigshafen (Rhine), W. Germany | g. | 2.6 |
| 10% aqueous glycerol solution | ml. | 32.5 |
| 5% aqueous solution of 50:50 mixture of the wetting agents [2] | ml. | 5.25 |
| 11.7% solution of saponine in a mixture of ethanol and water (1:4) | ml. | 5 |
| Water to make | g. | 500 |

[1] Formula:

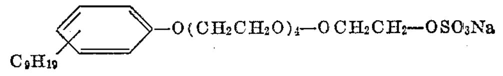

[2] Formulae:

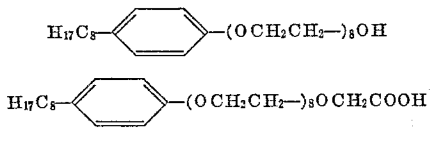

In a ratio of 45 g./sq. m. this mixture was coated at 35° C. on an unsubbed cellulose triacetate film of 0.10 mm. thickness serving as a temporary support.

(3) Preparation of the top layer.—Preliminary preparation of the photosensitive dispersion: In 200 ml. aqueous solution of 12 g. of gelatin 4 g. of N-vinylcarbazole were dispersed for 3 min. at 50° C. hereby the temperature rose to 72° C. Then 10 g. of tetrabromomethane were added and dispersed for 2 min., whereafter 6 g. of diphenylamine were admixed and dispersed for further 2 min. The dispersion was deaerated until most of the air bubbles had disappeared.

To this dispersion were added:

| | | |
|---|---|---|
| 10% aqueous dispersion of silica particles (average particle size 2–3μ) in a 8% by weight aqueous gelatin solution | g. | 15 |
| 11.7% solution of saponine in a mixture of ethanol-water (1:4) | ml. | 10 |
| Tergitol 4 (trade name for 7 - ethyl - 2 - methyl-4 - undecanol ester of sodium bisulphate marketed by Union Carbide and Carbon, New York, U.S.A.) | ml. | 7.5 |
| 10% solution of glycerol in water | ml. | 15 |
| Water, till | g. | 500 |

This top-layer composition was applied to the pigment layer at 25° C. in a ratio of 33 g./sq. m.

(B) Yellow colored photosensitive layer

The composition and preparation of the yellow pigment coating were the same as for the cyan pigment coating under (A) except for the use of 3.8 g. of Permanent NCG Gelb Colanyl Teig (C.I. 20,040) (trade name of Farbwerke Hoechst AG, Frankfurt (Main), W. Germany for a yellow pigment) instead of the cyan pigment.

(C) Magenta colored photosensitive layer

The composition and preparation of the magenta pigment coating were the same as for the cyan pigment coating under (A) except for the use of 5 g. of Litholscharlach BBM Pigmosol (C.I. 15,865) (trade name of Badische Anilin- & Soda-Fabrik A.G., Ludwigshafen (Rhine), W. Germany) instead of the cyan pigment.

(D) Black colored photosensitive layer

The composition and preparation of the black pigment coating were the same as for the cyan pigment coating under A except that 5.4 g. of carbon block dispersion P 130 (marketed by Degussa, Frankfurt (Main), W. Germany) and only 0.4 g. of the same cyan pigment dispersion were used.

(II) Preparation of the Permanent Support

A biaxially stretched polyethylene terephthalate film having a thickness of 180μ was subbed at both sides with the following composition at 25–30° C. in a ratio of 1.6 g./sq. m:

| | | |
|---|---|---|
| Copolymer of vinylidene chloride, N - tert. - butylacrylamide, n-butyl acrylate, and N-vinylpyrrolidone (70:23:3:4) | g. | 5.5 |
| Methylene chloride | ml. | 65 |
| 1,2-dichloroethane | ml. | 35 |

The resulting layer was coated with a mixture prepared as follows:

1350 g. of titanium dioxide (average particle size: 0.11μ) were dispersed in 5 l. of water containing 25 ml. of Dequest 2006 (trade name of Monsanto Chemical Company, St. Louis, Mo., U.S.A.) for a dispersing agent corresponding to the following structural formula:

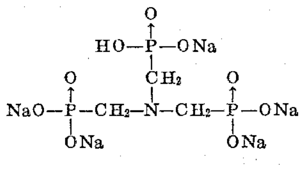

The dispersion was stirred rapidly for 10 min. at 5 to 15° C. and then heated to 35° C., at which temperature 400 ml. of a 10% by weight aqueous solution of gelatin were added, while rapid stirring was continued. Subsequently the following composition was added under slow stirring in order to avoid scumming:

| | Ml. |
|---|---|
| 10% aqueous solution of gelatin | 1800 |
| Water | 130 |
| 20% latex of the copolymer of butadiene and methyl methacrylate (50:50) | 2500 |
| 10% aqueous solution of the sodium salt of oleylmethyltauride | 37.5 |
| Ethylene chlorohydrin | 500 |

Coating was carried out in such a ratio that upon drying a layer of 5μ was obtained.

(III) Processing

The permanent support was imbibed for 1½ minute with an ethanol-water mixture. The volume ratio of ethanol and water was between 1 and 6:1 but preferably 2:1.

The cyan pigment coating on its temporary support was pressed in wet state between soft rollers in contact with the described wetted permanent support. After 30 sec. of contact the temporary support was stripped off, thus leaving the cyan pigment coating fixed on the permanent support. The transferred coating was air-dried and put in a vacuum frame in contact with the cyan printer separation halftone positive of a multicolor original to be printed.

The photosensitive pigment layer was exposed for 45 sec. with a pulsating xenon lamp 5 kw. with spiral burner (Baillout-Staub type) at 60 cm. distance.

The exposed pigment coating was dipped for 90 sec. in a tray containing the following hardening composition:

| | Ml. |
|---|---|
| 50% aqueous formaldehyde | 30 |
| 25% aqueous glutardialdehyde | 7 |
| Ethanol | 250 |
| Water, till | 1000 |

The relief was developed by washing without rubbing in running water of 35° C. Subsequently, the relief image was dipped for 1 min. in a mixture of ethanol and water (70:30% by volume).

In the same way as described for the cyan pigment coating, the yellow, magenta and black pigment coatings were transferred onto the already formed relief image and each exposure carried out in register through the proper halftone selection positives. The exposure times were adapted to the sensitivity of the differently pigmented recording layers.

The obtained multicolor image built up of superposed cyan, yellow, magenta and black relief images served as proof for the printer to judge of the quality of the cyan, yellow, magenta and black printer halftone selection positives.

EXAMPLE 2

(1) Preliminary preparation of the photosensitive dispersion: In 250 ml. aqueous solution of 30 g. of gelatin, 20 g. of N-vinylcarbazole were dispersed for 4 min. at 50° C. Hereby due to the vigorous stirring the temperature rose to 72° C. Thereupon 20 g. of tetrabromomethane were added and dispersed for 2 min., whereafter 20 g. of diphenylamine were admixed and dispersed for further 2 min. The dispersion was deaerated until most of the air bubbles had disappeared.

(2) Preparation of the subbing layer.—The following ingredients were mixed at 50° C.:

| | | |
|---|---|---|
| 20% aqueous gelatin solution | g. | 75 |
| 5% aqueous solution of Ultravon-W (a heptadecylbenzimidazole disoduim sulphonate dispersing agent marketed by Ciba AG Basel, Switzerland | ml. | 12 |
| 5% aqueous solution of 50:50 mixture of the wetting agents [1] | ml. | 5.25 |
| 11.7% solution of saponine in a mixture of ethanol and water (1:4) | ml. | 5 |
| Water to make | g. | 500 |

[1] Formulae:

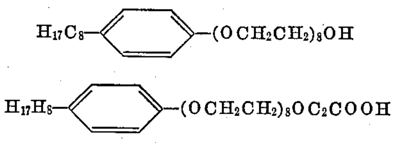

In a ratio of 30 g./sq. m. this mixture was coated at 35° C. on a polyester film, suitable for writing on with ink or pencil, a so-called drafting film consisting of a polyethylene terephthalate support double side coated with a semitransparent layer on the basis of titanium dioxide dispersed in hardened gelatin containing a latex polymer such as a copolymer of vinyl chloride, vinylidene chloride, n-butyl acrylate and itaconic acid (63:30:5:2 mole percent).

(3) Preparation of the photosensitive layer.—The following ingredients were mixed at 50° C.:

| | | |
|---|---|---|
| The photosensitive dispersion prepared as described above. | | |
| Dispersion of carbon black P130 (marketed by Degussa, Frankfurt (Main), W. Germany) | g. | 7.2 |
| Dispersion of Luconyl Blue LBGO (trade name of Badishe Anilin- & Soda-Fabrik A.G., Ludwigshafen (Rhine), W. Germany, for a cyan pigment) | g. | 0.6 |
| 5% aqueous solution of Ultravon W (trade name) | ml. | 12 |
| 5% aqueous solution of a 50:50 mixture of the wetting agents [1] | ml. | 5.25 |
| 11.7% solution of saponine in a mixture of ethanol and water (1:4) | ml. | 5 |
| Water to make | g. | 500 |

[1] Formulae:

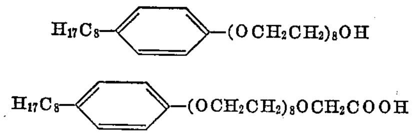

This photosensitive black layer was applied to the sublayer at 35° C. in a ratio of 35 g./sq. m.

(4) Processing: The dried photosensitive recording layer was exposed in direct contact with a tracing paper provided with a drawing of a machine part in black ink. The exposure was carried out with a 1000 watt ultra-violet light bulb for 10 sec. placed at a distance of 10 cm. from the photosensitive coating. A positive black relief image on the semitransparent support was obtained by washing off with running water of 25–35° C.

Other suitable drafting films that can be used as support for the photosensitive hydrophilic colloid layers applied according to the present invention are described in the Dutch patent application No. 7001115 filed Jan. 27, 1970 by Gevaert-Agfa N.V. These films behave like tracing paper e.g. allow a drawing or pattern to be retouched and are written on easily with pencil and ink.

EXAMPLE 3

(I) Preparation of the Photosensitive Layers (A) Cyan colored photosensitive layer (1) Preliminary preparation of the photosensitive dispersion: In 100 ml. of an aqueous solution of 20 g. gelatin, 20 ml. of an ethanolic solution containing 1 ml. of acetic acid, 20 ml. of tricresyl phosphate, 10 ml. of sulphodioctyl succinic acid ester disodium salt (5% in ethanol water 20:80), 15 g. of α,α,α-tribromomethylquinoxaline and 23 g. of disphenylamine, was dispersed for 1 min. at 50° C. The dispersion was deaerated till most of the air bubbles had disappeared.

(2) Preparation of the photosensitive colored layer.—The following ingredients were mixed at 50° C.:

| | | |
|---|---|---|
| The dispersion prepared as described above | | |
| 10% aqueous solution of a wetting agent [1] | ml | 8.2 |
| A cyan pigment dispersion of: Heliogenblau B Colanyl Teig (marketed by Badische Anilin- & Soda-Fabrik A.G., Ludwigshafen (Rhine), W. Germany) | g | 1.6 |
| 10% aqueous glycerol solution | ml | 19 |
| 5% aqueous solution of 50:50 mixture of the wetting agents [2] | ml | 3.1 |
| 11.7% solution of saponine in a mixture of ethanol and water (1:4) | ml | 3 |
| Water to make | g | 300 |

[1] Formula:

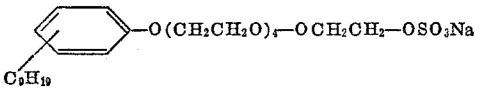

[2] Formulae:

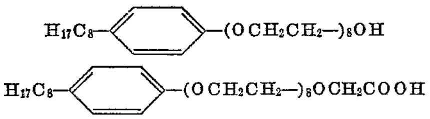

In a ratio of 45 g./sq. m. this mixture was coated at 35° C. on an unsubbed cellulose triacetate film of 0.10 mm. thickness serving as a temporary support.

(3) Preparation of the top layer.—Preliminary preparation of the photosensitive dispersion: In 100 ml. of an aqeous solution of 7 g. of gelatin, 8 ml. of an ethanolic solution containing 0.4 ml. of acetic acid, 8 ml. of tricresyl phosphate, 4 ml. of an anion active dispersing agent (5% in ethanol-water 20:80), 7.5 g. of α,α,α-tribromomethylquinoxaline and 12 g. of diphenylamine, was dispersed for 1 min. at 50° C. The dispersion was deaerated till most of the air bubbles had disappeared.

To this dispersion were added:

| | | |
|---|---|---|
| 10% aqueous dispersion of silica particles (average particle size 2–3μ) in a 8% by weight aqueous gelatin solution | g | 9 |
| 11.7% solution of saponine in a mixture of ethanol-water (1:4) | ml | 6 |
| 10% solution of glycerol in water | ml | 9 |
| Tergitol 4 (trade name for 7-ethyl-2-methyl-4-undecanol ester of sodium bisulphate marketed by Union Carbide and Carbon, New York, U.S.A.) | ml | 5 |
| Water, till | g | 300 |

This top-layer composition was applied to the pigment layer at 25° C. in a ratio of 33 g./sq. m.

(B) Yellow colored photosensitive layer

The composition and preparation of the yellow pigment coating were the same as for the cyan pigment coating under (A) except for the use of 2.3 g. of Permanent NCG Gelb Colanyl Teig (C.I. 20,040) (trade name of Farbwerke Hoechst AG, Frankfurt (Main), W. Germany for a yellow pigment) instead of the cyan pigment.

(C) Magenta colored photosensitive layer

The composition and preparation of the magenta pigment coating were the same as for the cyan pigment coating under (A) except for the use of 3 g. of Litholscharlach BBM Pigmosol (C.I. 15,865) (trade name of Badische Anilin- & Soda-Fabrik A.G., Ludwigshafen (Rhine), W. Germany) instead of the cyan pigment.

(D) Black colored photosensitive layer

The composition and preparation of the black pigment coating were the same as for the cyan pigment coating under (A) except that 3.3 g. of carbon black dispersion P130 (marketed by Degussa, Frankfurt (Main), W. Germany) and only 0.4 g. of the same cyan pigment dispersion were used.

(II) Preparation of the Permanent Support

As described in Example 1.

(III) Processing

As described in Example 1 yielding an analogous result.

EXAMPLE 4

(I) Preparation of the Photosensitive Layer (A) Cyan colored photosenstive layer (1) Preliminary preparation of the photosensitive dispersion: In 250 ml. of an aqueous solution of 30 g. of gelatin, 20 ml. of an ethanol solution containing 6 g. of 1,2-dihydro-2,2,4-trimethylquinoline, 20 g. of tetrabromomethane and 12 g. of N,N'-diphenyl-N,N'-diethylethylenediamine, was dispersed for 1 min. at 50° C. The dispersion was deaerated till most of the air bubbles had disappeared.

(2) Preparation of the photosensitive colored layer.—The following ingredients were mixed at 50° C.:

| | | |
|---|---|---|
| The dispersion prepared as described above | | |
| 10% aqueous solution of a wetting agent [1] | ml | 13.5 |
| A cyan pigment dispersion of: Heliogenblau B Colanyl Teig (marketed by Badische Anilin- & Soda-Fabrik A.G., Lugwigshafen (Rhine), W. Germany) | g | 2.6 |
| 10% aqueous glycerol solution | ml | 32.5 |
| 5% aqueous solution of 50:50 mixture of the wetting agent [2] | ml | 5.25 |
| 11.7% solution of saponine in a mixture of ethanol and water (1:4) | ml | 5 |
| Water to make | g | 500 |

[1] Formula:

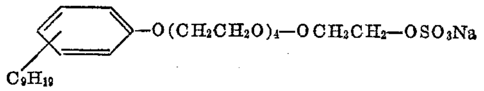

[2] Formulae:

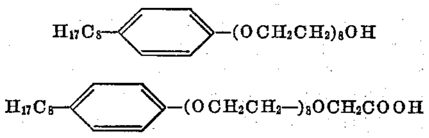

In a ratio of 45 g./sq. m. this mixture was coated at 35° C. on an unsubbed cellulose triacetate film of 0.10 mm. thickness serving as a temporary support.

(3) Preparation of the top layer.—Preliminary preparation of the photosensitive dispersion: In 200 ml. of an aqueous solution of 12 g. of gelatin, 20 ml. of an ethanolic solution containing 3 g. of 1,2-dihydro-2,2,4-trimethylquinoline, 10 g. of tetrabromomethane and 6 g. of N,N'-diphenyl N,N'-diethylethylenediamine, was dispersed for 1 min. at 50° C. The dispersion was deaerated till most of the air bubbles had been removed.

To this dispersion were added:

| | |
|---|---|
| 10% aqueous dispersion of silica particles (average particle size 2–3μ) in a 8% by weight aqueous gelatin solution ____g__ | 15 |
| 11.7% solution of saponine in a mixture of ethanol-water (1:4) ____ml__ | 10 |
| Tergitol 4 (trade name for 7-ethyl-2-methyl-4-undecanol ester of sodium bisulphate marketed by Union Carbide and Carbon, New York, U.S.A.) ml__ | 7.5 |
| 10% solution of glycerol in water ____ml__ | 15 |
| Water, till ____g__ | 500 |

This top-layer composition was applied to the pigment layer at 25° C. in a ratio of 33 g./sq. m.

(B) Yellow colored photosensitive layer

The composition and preparation of the yellow pigment coating were the same as for the cyan pigment coating under (A) except for the use of 3.8 g. of Permanent NCG Gelb Colonyl Teig (C.I. 20,040) (trade name of Farbwerke Hoechst AG, Frankfurt (Main), W. Germany, for a yellow pigment) instead of the cyan pigment.

(C) Magenta colored photosensitive layer

The composition and preparation of the magenta pigment coating were the same as for the cyan pigment coating under (A) except for the use of 5 g. of Litholscharlach BBM (Pigmosol (C.I. 15,865) (trade name of Badische Anilin- & Soda-Fabrik A.G., Luwigschafen (Rhine), W. Germany) instead of the cyan pigment.

(D) Black colored photosensitive layer

The composition and preparation of the black pigment coating were the same as for the cyan pigment coating under (A) except that 5.4 g. of carbon black dispersion P130 (marketed by Degussa, Frankfurt (Main), W. Germany) and only 0.4 g. of the same cyan pigment dispersion were used.

(II) Preparation of the Permanent Support

The same as described in Example 1.

(III) Processing

The same as described in Example 1 yielding an analogous result.

EXAMPLE 5

(I) Preparation of the Photosensitive Layer (A) Cyan color photosensitive layer (1) Preliminary preparation of the photosensitive dispersion: In 250 ml. aqueous solution of 30 g. of gelatin 10 g. of N-vinyl-carbazole were dispersed for 3 min. at 50° C. Hereby due to the vigorous stirring the temperature rose to 72° C. Then 25 g. of tetrabromomethane were added and dispersed for 2 min., whereafter 15 g. of N,N'-diphenyl-N,N'-diethylethylenediamine were admixed and dispersed for further 2 min. The dispersion was deaerated until most of the air bubbles had disappeared.

(2) Preparation of the photosensitive colored layer.—The following ingredients were mixed at 50° C.:

| | |
|---|---|
| The dispersion prepared as described above | |
| 10% aqueous solution of a wetting agent [1] ____ml__ | 13.5 |
| A cyan pigment dispersion of: Heliogenblau B Colanyl Teig (marketed by Badische Anilin- & Soda-Fabrik A.G., Ludwigshafen (Rhine), W. Germany) ____g__ | 2.6 |
| 10% aqueous glycerol solution ____ml__ | 32.5 |
| 5% aqueous solution of 50:50 mixture of the wetting agents [2] ____ml__ | 5.25 |
| 11.7% solution of saponine in a mixture of ethanol and water (1:4) ____ml__ | 5 |
| Water to make ____g__ | 500 |

[1] Formula:

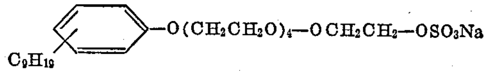

[2] Formulae:

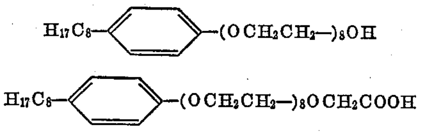

In a ratio of 45 g./sq. m. this mixture was coated at 35° C. on an unsubbed cellulose triacetate film of 0.10 mm. thickness serving as a temporary support.

(3) Preparation of the top layer.—Preliminary preparation of the photosensitive dispersion: In 200 ml. aqueous solution of 12 g. of gelatin, 4 g. of N-vinylcarbazole were dispersed for 3 min. at 50° C., whereafter 6 g. of diphenylamine were admixed and dispersed for further 2 min. The dispersion was deaerated till most of the air bubbles had been removed.

To this dispersion were added:

| | |
|---|---|
| 10% aqueous dispersion of silica particles (average particle size 2–3μ) in a 8% by weight aqueous gelatin solution ____g__ | 15 |
| 11.7% solution of saponine in a mixture of ethanol-water (1:4) ____ml__ | 10 |
| Tergitol 4 (trade name for 7-ethyl-2-methyl-4-undecanol ester of sodium hydrogen sulphate marketed by Union Carbide and Carbon, New York, U.S.A.) ____ml__ | 7.5 |
| Water, till ____g__ | 500 |

This top-layer composition was applied to the pigment layer at 25° C. in a ratio of 33 g./sq. m.

(B) Yellow colored photosensitive layer

The composition and preparation of the yellow pigment coating were the same as for the cyan pigment coating under (A) except for the use of 3.8 g. of Permanent NCG Gelb Colanyl Teig (C.I. 20,040) (trade name of Farbwerke Hoescht AG, Frankfurt (Main), W. Germany for a yellow pigment) instead of the cyan pigment.

(C) Magenta colored photosensitive layer

The composition and preparation of the magenta pigment coating were the same as for the cyan pigment coating under (A) except for the use of 5 g. of Litholscharlach BBM Pigmosol (C.I. 15,865) (trade name of Badische Anilin- & Soda-Fabrik A.G., Ludwigshafen (Rhine), W. Germany) instead of the cyan pigment.

(D) Black colored photosensitive layer

The composition and preparation of the black pigment coating were the same as for the cyan pigment coating under (A) except that 5.4 g. of carbon black dispersion P 130 (marketed by Degussa, Frankfurt (Main), W. Germany) and only 0.4 g. of the same cyan pigment dispersion were used.

(II) Preparation of the Permanent Support

The same as described in Example 1.

(III) Processing

The same as described in Example 1 yielding analogous results.

EXAMPLE 6

(I) Preparation of the Photosensitive Layer (A) Cyan colored photosensitive layer (1) Preliminary preparation of the photosensitive dispersion: In 250 ml. aqueous solution of 30 g. of gelatin, 25 g. of N-vinyl-carbazole were dispersed for 3 min. at 50° C. As a result of the vigorous stirring the temperature rose to 72° C. Then 25 g. of tetrabromomethane dissolved in 35 ml. of ethylene glycol monomethyl ether were added and dispersed for 2 min. whereupon 30 mg. of 2-[p-dimethylaminostyryl]quinoline as spectral sensitizing agent dissolved in 10 ml. of a mixture of equal volumes of ethanol and water were admixed and dispersed for further 30 sec. The dispersion was deaerated until most of the air bubbles had disappeared.

(2) Preparation of the photosensitive colored layer.—The following ingredients were mixed at 50° C.:

| | | |
|---|---|---|
| The dispersion prepared as described above 10% aqueous solution of a wetting agent [1] | ml. | 13.5 |
| A cyan pigment dispersion of: Heliogenblau B Colanyl Teig (marketed by Badische Anilin- & Soda-Fabrik A.G., Lugwingshafen (Rhine), W. Germany) | g. | 2.6 |
| 10% aqueous glycerol solution | ml. | 32.5 |
| 5% aqueous solution of 50:50 mixture of the wetting agents [2] | ml. | 5.25 |
| 11.7% solution of saponine in a mixture of ethanol and water (1:4) | ml. | 5 |
| Water to make | g. | 500 |

[1] Formula:

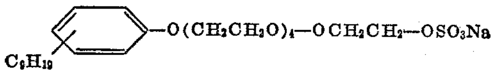

[2] Formulae:

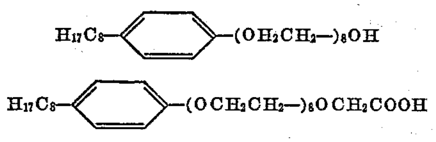

In a ratio of 45 g./sq. m. this mixture was coated at 35° C. on an unsubbed cellulose triacetate film of 0.10 mm. thickness serving as a temporary support.

(3) Preparation of the top layer.—Preliminary preparation of the photosensitive dispersion: In 200 ml. aqueous solution of 12 g. of gelatin 10 g. of N-vinylcarbazole were dispersed for 3 min. at 50° C. hereby the temperature rose to 72° C. Then 10 g. of tetrabromomethane solved in 15 ml. of methyl Cellosolve were added and dispersed for 2 min., whereafter 10 mg. of 2-[p-dimethylaminostyryl]quinoline, solved in 5 ml. of a mixture ethanol-water 1:1, were admixed and dispersed for further 30 sec. The dispersion was deaerated until most of the air bubbles had been removed.

To this dispersion were added:

| | | |
|---|---|---|
| 10% aqueous dispersion of silica particles (average particle size 2–3$\mu$) in a 8% by weight aqueous gelatin solution | g. | 15 |
| 11.7% solution of saponine in a mixture of ethanol-water (1:4) | ml. | 10 |
| Tergitol 4 (trade name for 7-ethyl-2-methyl-4-undecanol ester of sodium bisulphate marketed by Union Carbide and Carbon, New York, U.S.A.) | ml. | 7.5 |
| Water, till | g. | 500 |

This top layer composition was applied to the pigment layer at 25° C. in a ratio of 33 g./sq. m.

(B) Yellow colored photosensitive layer

The composition and preparation of the yellow pigment coating were the same as for the cyan pigment coating under (A) except for the use of 3.8 g. of Permanent NCG Gelb Colanyl Teig (C.I. 20,040) (trade name of Farbwerke Hoechst A.G., Frankfurt (Main), W. Germany, for a yellow pigment) instead of the cyan pigment.

(C) Magenta colored photosensitive layer

The composition and preparation of the magenta pigment coating were the same as for the cyan pigment coating under (A) except for the use of 5 g. of Litholscharlach BBM Pigmosol (C.I. 15,865) (trade name of Badische Anilin- & Soda-Fabrik A.G., Ludwigshaften (Rhine), W. Germany) instead of the cyan pigment.

(D) Black colored photosensitive layer

The composition and preparation of the black pigment coating were the same as for the cyan pigment coating under (A) except that 5.4 g. of carbon black dispersion P130 (marketed by Degussa, Frankfurt (Main), W. Germany) and only 0.4 g. of the same cyan pigment dispersion were used.

(II) Preparation of the Permanent Support

The same as described in Example 1.

(III) Processing

The same as described in Example 1 yielding analogous results.

We claim:

1. A process for the production of a colloid pattern, containing the steps of:

(1) information-wise exposing a hydrophilic colloid layer containing a mixture of:
   (a) a photosensitive organic polyhalogen compound, which is capable of forming by exposure to activating electromagnetic radiation (a) halogen-containing free radical(s),
   (b) an amino compound with aromatic character, and
   (c) a hydrophilic colloid that is capable of undergoing a hardening or decrease of water-solubility by a treatment with an aldehyde hardening agent suited for the hardening of protein colloids, (2) treating the information-wise exposed colloid layer with said aldehyde hardening agent effecting a selective hardening in the unexposed portions of the recording layer, and (3) removing the exposed portions of the colloid layer by means of a wash-off treatment leaving a relief pattern corresponding with the non-exposed portions of the colloid layer.

2. A process according to claim 1, wherein the colloid layer already before its exposure contains (a) dye(s) and/or (a) pigment(s).

3. A process according to claim 1 modified in such a way that it yields a multicolor pattern, which process contains the following steps:

(1) transferring a colored hydrophilic colloid layer, which contains at least one aromatic amino compound and at least one photosensitive organic polyhalogen compound, from a temporary support, which is relatively hydrophobic in respect of a permanent support, to which said layer has to be transferred, to said permanent support by pressing it in the presence of an aqueous liquid against said colloid layer, and removing the temporary support, thus leaving the said layer on the permanent support, (2) exposing the transferred colloid layer in substantially dry state to information-wise modulated electromagnetic radiation resulting in the information-wise photolysis of the halogen-containing compound, (3) treating the exposed colloid layer with an aldehyde hardening agent that hardens said polymeric compound in the unexposed portions, (4) removing the exposed portions of the colloid layer by a wash-off treatment, and in order to produce superposed color patterns on a same permanent support repeating the steps (1), (2), (3) and (4) with said hydrophilic colloid layers having the desired color.

4. A process according to any of the preceding claims, wherein the photosensitive organic polyhalogen compound corresponds to the following general formula:

$$R—CX_3$$

wherein:

R is hydrogen, chlorine, bromine or iodine, an alkyl group including a substituted alkyl group, or an aromatic hydrocarbon group including a substituted aromatic hydrocarbon group, a heterocyclic group, including a substituted heterocyclic group, an acyl group, including a carboxylic acid acyl group, a sulphonic acid acyl group and a sulphinic acid acyl group, a carboxyl group, a carboxylic acid ester group, an amide group or an aldehyde group, and each of X is chlorine, bromine or iodine.

5. A process according to claim 1, wherein the photosensitive organic halogen-containing compound is carbon tetrabromide.

6. A process according to claim 1, wherein the hydrophilic colloid layer contains a primary, secondary and/or tertiary amine having an aromatic character.

7. A process according to claim 6, wherein the amine corresponds to the following general formula:

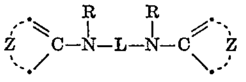

wherein:

R represents an alkyl group,

Z represents the necessary atoms to close a ring or ring system having an aromatic character, and L represents a bivalent organic group being capable to link two amino groups.

8. A process according to claim 1, wherein the photosensitive organic polyhalogen compound is applied in the hydrophilic colloid layer in dissolved form in a dispersed water-immiscible organic high boiling substance.

9. A process according to claim 8, wherein said high boiling substance is N-vinylcarbazole, dibutylphthalate, tricresyl phosphate, 1,2-dihydro-2,2,4-trimethylquinoline or ethylene glycol monomethyl ether.

10. A process according to the preceding claim 1, wherein the hydrophilic colloid is gelatin.

11. A process according to claim 10, wherein the photosensitive organic polyhalogen compound(s) are present in a range of 15 to 40% by weight in respect of the dry gelatin.

12. A process according to claim 10, wherein the amino compound having an aromatic character is present in a range of 15 to 40% by weight in respect of the dry gelatin.

13. A photosensitive recording material having a recording layer containing:

(a) at least one photosensitive organic polyhalogen compound capable of forming by exposure to activating electromagnetic radiation (a) halogen-containing free radical(s), (b) at least one amino compound having an aromatic character, (c) a hydrophilic colloid that is capable of undergoing a hardening or decrease of water-solubility by a treatment with an aldehyde hardening agent suited for the hardening of protein colloids, and (d) a dye or pigment particles for overall coloring said layer.

14. A photosensitive recording material according to claim 13, wherein the photosensitive organic polyhalogen compound corresponds to the following general formula:

$$R—CX_3$$

wherein:

R is hydrogen, chlorine, bromine or iodine, an alkyl group, including a substituted alkyl group or an aromatic hydrocarbon group including a substituted aromatic hydrocarbon group, a heterocyclic group including a substituted heterocyclic group, an acyl group, including a carboxylic acid acyl group, a sulphonic acid acyl group and a sulphinic acid acyl group, a carboxyl group, a carboxylic acid ester group, an amide group or an aldehyde group, and group, a carboxylic acid ester group, an amide group or an aldehyde group, and each of X is chlorine, bromine or iodine.

15. A photosensitive recording material according to claim 13, wherein the photosensitive organic polyhalogen compound is carbon tetrabromide.

16. A photosensitive recording material according to claim 13, wherein the photosensitive organic polyhalogen compound is present in the recording layer in dissolved form in a dispersed organic water-immiscible high-boiling substance.

17. A photosensitive recording material according to claim 13, wherein the amino compound having an aromatic character corresponds to the following general formula:

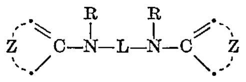

wherein:

R represents an alkyl group,

Z represents the necessary atoms to close a ring or ring system having an aromatic character, and L represents a bivalent organic group being capable to link two amino groups.

18. A photosensitive recording material according to claim 13, wherein the amino compound is diphenylamine or N,N'-diphenyl-N,N'-diethylethylenediamine.

19. A photosensitive recording material according to claim 13, wherein the hydrophilic colloid is gelatin.

20. A photosensitive recording material according to claim 13, wherein the recording layer contains a styryl dye base or azastyryl dye base as sensitizing agent.

References Cited

UNITED STATES PATENTS

| | | | |
|---|---|---|---|
| 3,042,515 | 7/1962 | Wainer | 96—48 R |
| 3,147,117 | 9/1964 | Wainer et al. | 96—48 R |

NORMAN G. TORCHIN, Primary Examiner

A. T. SURO PICO, Assistant Examiner

U.S. Cl. X.R.

96—13, 14, 23, 35, 36, 36.3, 90 R

UNITED STATES PATENT OFFICE
CERTIFICATE OF CORRECTION

Patent No. 3,728,120 Dated April 17, 1973

Inventor(s) Edwin Hendrik HAZENBOSCH et al

It is certified that error appears in the above-identified patent and that said Letters Patent are hereby corrected as shown below:

Column 22, Claim 13, line 2, after "character", insert -- present in said layer in the form of a solution in an organic water-immiscible high boiling substance which solution is dispersed through said layer, --.

Column 22, Claim 16, Cancel in entirety.

Column 1, line 10, "20 Claims" should read -- 19 Claims --; and Claims 17, 18, 19 and 20 will be renumbered to read -- 16, 17, 18 and 19, respectively.

Signed and sealed this 26th day of March 1974.

(SEAL)
Attest:

EDWARD M.FLETCHER,JR.
Attesting Officer

C. MARSHALL DANN
Commissioner of Patents

FORM PO-1050 (10-69)
USCOMM-DC 60376-P69
★ U.S. GOVERNMENT PRINTING OFFICE : 1969 O—366-334